(12) United States Patent
Kong et al.

(10) Patent No.: US 10,804,862 B2
(45) Date of Patent: Oct. 13, 2020

(54) HIGH FREQUENCY SIGNAL AMPLIFIER INCLUDING BALUN

(71) Applicant: ELECTRONICS AND TELECOMMUNICATIONS RESEARCH INSTITUTE, Daejeon (KR)

(72) Inventors: Sun Woo Kong, Daejeon (KR); Myung Don Kim, Daejeon (KR); Cheol Ho Kim, Daejeon (KR); Hui Dong Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 39 days.

(21) Appl. No.: 16/201,754

(22) Filed: Nov. 27, 2018

(65) Prior Publication Data
US 2019/0207567 A1 Jul. 4, 2019

(30) Foreign Application Priority Data
Dec. 28, 2017 (KR) .................. 10-2017-0181965

(51) Int. Cl.
*H03F 1/56* (2006.01)
*H03F 3/195* (2006.01)
*H03H 7/38* (2006.01)
*H03H 7/42* (2006.01)
*H03F 3/24* (2006.01)

(52) U.S. Cl.
CPC ............... *H03F 1/565* (2013.01); *H03F 1/56* (2013.01); *H03F 3/195* (2013.01); *H03F 3/245* (2013.01); *H03H 7/38* (2013.01); *H03H 7/42* (2013.01); *H03F 2200/06* (2013.01); *H03F 2200/222* (2013.01); *H03F 2200/451* (2013.01)

(58) Field of Classification Search
CPC ....................................................... H03F 1/565
See application file for complete search history.

(56) References Cited

U.S. PATENT DOCUMENTS

| | | | |
|---|---|---|---|
| 4,706,048 A | 11/1987 | Atalar | |
| 7,330,085 B2 | 2/2008 | Ezzeddine | |
| 7,538,618 B2 | 5/2009 | Park et al. | |
| 7,737,789 B2 * | 6/2010 | Eisenstadt | H03F 3/265 330/310 |
| 7,884,673 B2 | 2/2011 | Han et al. | |
| 7,948,322 B2 | 5/2011 | Lee | |
| 8,229,367 B2 | 7/2012 | Chan et al. | |

(Continued)

*Primary Examiner* — Patricia T Nguyen (57) ABSTRACT

High frequency signal amplifier including balun is disclosed. The amplifier comprises an input terminal ($V_{in}$) through which the high frequency signal is input; a balun which is connected to the input terminal and outputs a first differential signal and a second differential signal based on the high frequency signal; a transistor (M) which is connected to the balun and outputs an amplified high frequency signal based on the first differential signal and the second differential signal; an output terminal which is connected to the transistor (M) and through which the amplified high frequency signal is acquired and the amplified high frequency signal is output. Therefore, performance of the amplifier can be enhanced.

10 Claims, 9 Drawing Sheets

(56) References Cited

U.S. PATENT DOCUMENTS

| | | |
|---|---|---|
| 8,576,005 B2 | 11/2013 | Liao |
| 9,543,760 B2 * | 1/2017 | Akizuki .................... H01P 5/12 |
| 9,608,568 B2 | 3/2017 | Ro et al. |
| 9,859,868 B2 | 1/2018 | Maurer |
| 2007/0205829 A1 * | 9/2007 | Kao ........................ H03F 1/223 |
| | | 330/301 |
| 2012/0112850 A1 * | 5/2012 | Kim ........................ H03H 7/38 |
| | | 333/32 |
| 2018/0226367 A1 * | 8/2018 | Babcock ................. H03F 3/195 |
| 2019/0074802 A1 * | 3/2019 | Geha ........................ H03F 1/22 |

* cited by examiner

HIGH FREQUENCY SIGNAL AMPLIFIER INCLUDING BALUN

CLAIM FOR PRIORITY

This application claims priority to Korean Patent Application No. 2017-0181965 filed on Dec. 28, 2017 in the Korean Intellectual Property Office (KIPO), the entire contents of which are hereby incorporated by reference.

BACKGROUND

1. Technical Field

Example embodiments of the present invention relate to an amplifier for a signal in a wireless communication system, and more specifically, to an amplifier used for amplifying a high frequency signal.

2. Related Art

A transmitter (for example, a base station and a terminal) of a wireless communication system may include a signal processor, a mixer, a local oscillator, an amplifier, an antenna, and the like. The signal processor may perform a coding operation, an interleaving operation, a scrambling operation, a modulation operation, and the like on a data stream. A signal output from the signal processor may be a baseband signal or an intermediate frequency signal.

The signal output from the signal processor may be input to the mixer. The signal input to the mixer may be converted into a high frequency signal by the local oscillator. The high frequency signal output from the mixer may be input to the amplifier, and the high frequency signal may be amplified by the amplifier. The amplified high frequency signal output from the amplifier may be input to the antenna, and the amplified high frequency signal may be transmitted to a receiver through the antenna.

On the other hand, when impedance matching is not performed between components (for example, a resistor, a capacitor, an inductor, and the like) included in the amplifier, performance of the amplifier may be lowered due to characteristics of the high frequency signal. For example, the high frequency signal may be leaked or attenuated by a parasitic component (for example, a parasitic capacitor or a parasitic inductor) in the amplifier to reduce a waveform of the high frequency signal. As a result, amplifying performance of the high frequency signal in the amplifier may be lowered.

To solve this problem, source degeneration technology may be applied to the amplifier. However, when the source degeneration technique is applied to the amplifier, a gain of the amplifier may be reduced.

SUMMARY

Accordingly, example embodiments of the present invention are provided to substantially obviate one or more problems due to limitations and disadvantages of the related art.

In order to solve the above problems, example embodiments of the present invention provide an amplifier for processing a high frequency signal. The amplifier comprises an input terminal ($V_{in}$) through which the high frequency signal is input; a balun which is connected to the input terminal to acquire the high frequency signal from the input terminal and outputs a first differential signal and a second differential signal based on the high frequency signal; a transistor (M) which is connected to the balun to acquire the first differential signal and the second differential signal from the balun and outputs an amplified high frequency signal based on the first differential signal and the second differential signal; a load which is connected to the transistor (M); and an output terminal which is connected to the transistor (M) and through which the amplified high frequency signal is acquired and the amplified high frequency signal is output, wherein a phase difference between the first differential signal and the second differential signal is 180°.

The balun may include an inductor #1 (L1), an inductor #2 (L2), a capacitor #1 (C1), and a capacitor #2 (C2), wherein: the inductor #1 (L1) has one end connected to the input terminal ($V_{in}$) and the other end connected to a gate of the transistor (M); the capacitor #1 (C1) is parallel with the inductor #1 (L1) and has one end connected to the gate of the transistor (M) and the other end connected to a ground; the capacitor #2 (C2) has one end connected to the input terminal ($V_{in}$) and the other end connected to a source of the transistor (M); and the inductor #2 (L2) is parallel with the capacitor #2 (C2) and has one end connected to the source of the transistor (M) and the other end connected to the ground.

The transistor (M) may be an n-channel metal oxide semiconductor (NMOS) transistor.

In order to solve the above problems, example embodiments of the present invention provide an amplifier for processing a high frequency signal. The amplifier comprises an input terminal ($V_{in}$) through which the high frequency signal is input; a transistor #1 (M1) which is connected to the input terminal to acquire the high frequency signal and outputs an output signal based on the high frequency signal; a balun which is connected to the transistor #1 (M1) to acquire the output terminal from the transistor #1 and outputs a first differential signal and a second differential signal based on the output signal; a transistor #2 (M2) which is connected to the balun to acquire the first differential signal and the second differential signal from the balun and outputs an amplified high frequency signal based on the first differential signal and the second differential signal; a load which is connected to the transistor #2 (M2); and an output terminal which is connected to the transistor #2 (M2) and through which the amplified high frequency signal is acquired and the amplified high frequency signal is output, wherein a phase difference between the first differential signal and the second differential signal is 180°.

The balun may include an inductor #1 (L1), an inductor #2 (L2), a capacitor #1 (C1), and a capacitor #2 (C2), wherein: the capacitor #1 (C1) has one end connected to a drain of the transistor #1 (M1) and the other end connected to a gate of the transistor #2 (M2); the inductor #1 (L1) is parallel with the capacitor #1 (C1) and has one end connected to the gate of the transistor #2 (M2); the inductor #2 (L2) has one end connected to the drain of the transistor #1 (M1) and the other end connected to a source of the transistor #2 (M2); and the capacitor #2 (C2) is parallel with the inductor #2 (L2) and has one end connected to the source of the transistor # (M2) and the other end connected to a ground.

A bias current of the transistor #2 (M2) may be introduced into the transistor #1 (M1) by the inductor #2 (L2) and is reused in the transistor #1 (M1).

Each of the transistor #1 (M1) and the transistor #2 (M2) may be an n-channel metal oxide semiconductor (NMOS) transistor and be configured in a form of a stack in the amplifier.

In order to solve the above problems, example embodiments of the present invention provide an amplifier for processing a high frequency signal. The amplifier comprises an input terminal ($V_{in}$) through which the high frequency signal is input; a balun #1 which is connected to the input terminal to acquire the high frequency signal from the input terminal and outputs a first differential signal #11 and a second differential signal #12 based on the high frequency signal; a transistor #1 (M1) which is connected to the balun #1 to acquire the differential signal #11 and the differential signal #12 from the balun #1 and outputs an amplified high frequency signal #1 based on the differential signal #11 and the differential signal #12; a balun #2 which is connected to the transistor #1 (M1) to acquire amplified high frequency signal #11 and outputs a differential signal #21 and a differential signal #22 based on the amplified high frequency signal #1; a transistor #2 (M2) which is connected to the balun #2 to acquire the differential signal #21 and the differential signal #22 from the balun #2 and outputs an amplified high frequency signal #2 based on the differential signal #21 and the differential signal #22; a load which is connected to the transistor #2 (M2); and an output terminal which is connected to the transistor #2 (M2) and through which the amplified high frequency signal #2 is acquired and the amplified high frequency signal #2 is output.

A phase difference between the differential signal #11 and the differential signal #12 may be 180°, and a phase difference between the differential signal #21 and the differential signal #22 may be 180°

The balun #1 may include an inductor #11 (L11), an inductor #12 (L12), a capacitor #11 (C11), and a capacitor #12 (C12), wherein: the inductor #11 (L11) has one end connected to the input terminal ($V_{in}$) and the other end connected to a gate of the transistor #1 (M1); the capacitor #11 (C11) is parallel with the inductor #11 (L11) and has one end connected to the to gate of the transistor #1 (M1) and the other end connected to a ground; the capacitor #12 (C12) has one end connected to the input terminal ($V_{in}$) and the other end connected to a source of the transistor #1 (M1); and the inductor #12 (L12) is parallel with the capacitor #12 (C12) and has one end connected to the source of the transistor #1 (M1) and the other end connected to the ground.

The balun #2 may include an inductor #21 (L21), an inductor #22 (L22), a capacitor #21 (C21), and a capacitor #22 (C22), wherein: the capacitor #21 (C21) has one end connected to a drain of the transistor #1 (M1) and the other end connected to a gate of the transistor #2 (M2); the inductor #21 (L21) is parallel with the capacitor #21 (C21) and has one end connected to the gate of the transistor #2 (M2); the inductor #22 (L22) has one end connected to the drain of the transistor #1 (M1) and the other end connected to a source of the transistor #22 (M2); and the capacitor #22 (C22) is parallel with the inductor #22 (L22) and has one end connected to the source of the transistor #2 (M2) and the other end connected to a ground.

A bias current of the transistor #2 (M2) may be introduced into the transistor #1 (M1) by the inductor #2 (L2) and is reused in the transistor #1 (M1).

Each of the transistor #1 (M1) and the transistor #2 (M2) may be an n-channel metal oxide semiconductor (NMOS) transistor and is configured in a form of a stack.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in greater detail with reference to the accompanying drawings. To facilitate overall understanding of the present invention, like numbers refer to like elements throughout the description of the drawings, and description of the same component will not be reiterated.

Figure 1:
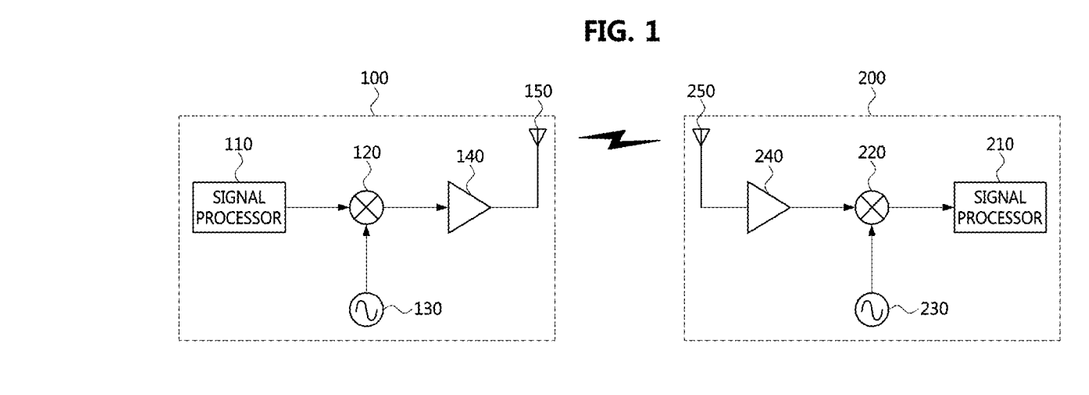
FIG. 1 is a block diagram illustrating structures of a transmitter and a receiver in a wireless communication system.

FIG. 1 is a block diagram illustrating structures of a transmitter and a receiver in a wireless communication system.

Referring to FIG. 1, a transmitter 100 may include a signal processor 110, a mixer 120, a local oscillator 130, an amplifier 140, an antenna 150, and the like. The signal processor 110 of the transmitter 100 may perform a coding operation, an interleaving operation, a scrambling operation, a modulation operation, and the like on a data stream. A signal output from the signal processor 110 of the transmitter 100 may be a baseband signal or an intermediate frequency signal.

The signal output from the signal processor 110 of the transmitter 100 may be input to the mixer 120 of the transmitter 100. The signal input to the mixer 120 of the transmitter 100 may be converted into a high frequency signal by the local oscillator 130 of the transmitter 100. The high frequency signal output from the mixer 120 of the transmitter 100 may be input to the amplifier 140 of the transmitter 100, and the high frequency signal may be amplified by the amplifier 140 of the transmitter 100. The amplified high frequency signal output from the amplifier 140 of the transmitter 100 may be input to the antenna 150 of the transmitter 100, and the amplified high frequency signal may be transmitted to the receiver 200 through the antenna 150 of the transmitter 100.

The receiver 200 may include a signal processor 210, a mixer 220, a local oscillator 230, an amplifier 240, an antenna 250, and the like. The antenna 250 of the receiver 200 may receive a high frequency signal from the transmitter 100, and the high frequency signal output from the antenna 250 of the receiver 200 may be input to the amplifier 240 of the receiver 200. The amplifier 240 of the receiver 200 may amplify the high frequency signal and may output the amplified high frequency signal. The amplified high frequency signal may be input to the mixer 220 of the receiver 200. The amplified high frequency signal input to the mixer 220 of the receiver 200 may be converted into an intermediate frequency signal or a baseband signal by the local oscillator 230 of the receiver 200. A signal output from the mixer 220 of the receiver 200 may be input to the signal processor 210 of the receiver 200. The signal processor 210 of the receiver 200 may perform a demodulation operation, a descrambling operation, a deinterleaving operation, a decoding operation, and the like on a signal.

Figure 2:
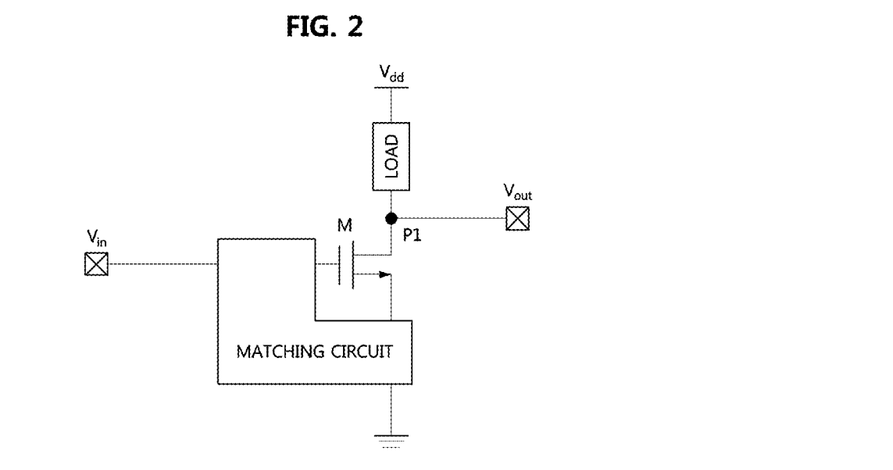
FIG. 2 is a block diagram illustrating a first example embodiment of an amplifier.

FIG. 2 is a block diagram illustrating a first example embodiment of an amplifier.

Referring to FIG. 2, the amplifier (for example, the amplifier 140 or 240 of FIG. 1) may include a matching circuit, an n-channel metal oxide semiconductor (NMOS) transistor M, a load, and the like. A high frequency signal output from the mixer 120 of the transmitter 100 or the antenna 250 of the receiver 200 may be input through an input terminal $V_{in}$ of the amplifier. The high frequency signal may be transferred to the matching circuit through the input terminal $V_{in}$ of the amplifier. The matching circuit may be used for preventing a high frequency signal from being reflected. In addition, the matching circuit may be used for impedance matching inside the amplifier.

An output terminal of the matching circuit may be connected to each of a gate and a source of the NMOS transistor M. The NMOS transistor M may be used for amplifying a high frequency signal. A drain of the NMOS transistor M may be connected to a node P1 (for example, an output terminal $V_{out}$ of the amplifier and the load). The load may include at least one resistor. The high frequency signal input through the input terminal $V_{in}$ of the amplifier may be amplified by components in the amplifier (for example, the matching circuit, the NMOS transistor M, the load, and the like). The amplified high frequency signal may be output through the output terminal $V_{out}$ of the amplifier. The high frequency signal output through the output terminal $V_{out}$ of the amplifier may be input to the antenna 150 of the transmitter 100 or the mixer 220 of the receiver 200.

Figure 3:
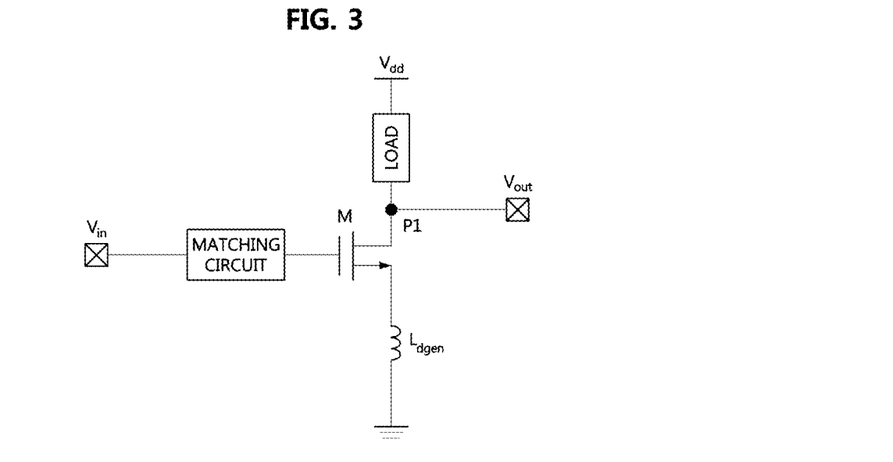
FIG. 3 is a block diagram illustrating a second example embodiment of an amplifier.

FIG. 3 is a block diagram illustrating a second example embodiment of an amplifier.

Referring to FIG. 3, the amplifier (for example, the amplifier 140 or 240 of FIG. 1) may include a matching circuit, an NMOS transistor M, an inductor $L_{dgen}$, a load, and the like. The amplifier may be operated based on a source degeneration method. A high frequency signal output from the mixer 120 of the transmitter 100 or the antenna 250 of the receiver 200 may be input through an input terminal $V_{in}$ of the amplifier. The high frequency signal may be transferred to the matching circuit through the input terminal $V_{in}$ of the amplifier. The matching circuit may be used for preventing a high frequency signal from being reflected. In addition, the matching circuit may be used for impedance matching inside the amplifier.

An output terminal of the matching circuit may be connected to a gate of an NMOS transistor M. The NMOS transistor M may be used for amplifying a high frequency signal. A source of the NMOS transistor M may be connected to the inductor $L_{dgen}$. Input impedance of the NMOS transistor M may be adjusted by the inductor $L_{dgen}$. The input impedance of the amplifier, excluding the matching circuit, may be defined based on Expression 1 below.

$$jwL_{dgen}(\text{first term}) + 1/(jwC_{GS})(\text{second term}) + gm \cdot L_{dgen}/(C_{GS})(\text{third term}) \qquad [\text{Expression 1}]$$

A value of the inductor $L_{dgen}$ may be adjusted by a real component, i.e., the third term of Expression 1. However, when the source degeneration method is applied to the amplifier, a gain of the amplifier may be reduced.

On the other hand, a drain of the NMOS transistor M may be connected to a node P1 (for example, an output terminal $V_{out}$ of the amplifier and the load). The load may include at least one resistor. The high frequency signal input through the input terminal $V_{in}$ of the amplifier may be amplified by components in the amplifier (for example, the matching circuit, the NMOS transistor M, the inductor $L_{dgen}$, the load, and the like). The amplified high frequency signal may be output through the output terminal $V_{out}$ of the amplifier. The high frequency signal output through the output terminal $V_{out}$ of the amplifier may be input to the antenna 150 of the transmitter 100 or the mixer 220 of the receiver 200.

Figure 4:
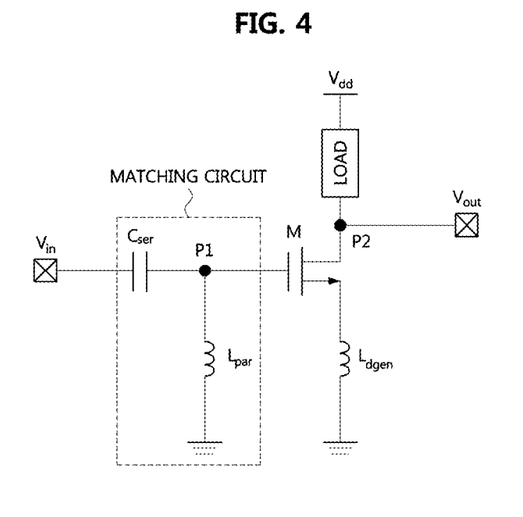
FIG. 4 is a block diagram illustrating a third embodiment of an amplifier.

FIG. 4 is a block diagram illustrating a third embodiment of an amplifier.

Referring to FIG. 4, the amplifier (for example, the amplifier 140 or 240 of FIG. 1) may include a matching circuit, an NMOS transistor M, an inductor $L_{dgen}$, a load, and the like. The amplifier may be operated based on a source degeneration method. A high frequency signal output from the mixer 120 of the transmitter 100 or the antenna 250 of the receiver 200 may be input through an input terminal $V_{in}$ of the amplifier. The high frequency signal may be transferred to the matching circuit through the input terminal $V_{in}$ of the amplifier. The matching circuit may include a capacitor $C_{ser}$ and an inductor $L_{par}$.

One end of the capacitor $C_{ser}$ of the matching circuit may be connected to the input terminal $V_{in}$ of the amplifier, and the other end of the capacitor $C_{ser}$ of the matching circuit may be connected to a node P1 (for example, a gate of an NMOS transistor M and the inductor $L_{par}$). One end of the inductor $L_{par}$ of the matching circuit may be connected to P1 (for example, the gate of the NMOS transistor M and the capacitor $C_{ser}$), and the other end of the inductor $L_{par}$ of the matching circuit be connected to a ground. A connection structure between the capacitor $C_{ser}$ and the inductor $L_{par}$ in the matching circuit may be a serial-parallel structure.

An output terminal of the matching circuit may be connected to the gate of the NMOS transistor M. The NMOS transistor M may be used for amplifying a high frequency signal. A source of the NMOS transistor M may be connected to the inductor $L_{dgen}$. Input impedance of the NMOS transistor M may be adjusted by the inductor $L_{dgen}$. A drain of the NMOS transistor M may be connected to a node P2 (for example, the output terminal $V_{out}$ of the amplifier and the load). The load may include at least one resistor. The high frequency signal input through the input terminal $V_{in}$ of the amplifier may be amplified by components in the amplifier (for example, the matching circuit, the NMOS transistor M, the inductor $L_{dgen}$, the load, and the like). The amplified high frequency signal may be output through the output terminal $V_{out}$ of the amplifier. The high frequency signal output through the output terminal $V_{out}$ of the amplifier may be input to the antenna 150 of the transmitter 100 or the mixer 220 of the receiver 200.

Figure 5:
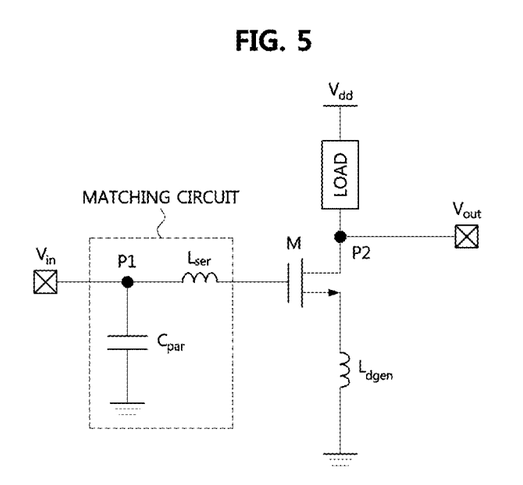
FIG. 5 is a block diagram illustrating a fourth example embodiment of an amplifier.

FIG. 5 is a block diagram illustrating a fourth example embodiment of an amplifier.

Referring to FIG. 5, the amplifier (for example, the amplifier 140 or 240 of FIG. 1) may include a matching circuit, an NMOS transistor M, an inductor $L_{dgen}$, a load, and the like. The amplifier may be operated based on a source degeneration method. A high frequency signal output from the mixer 120 of the transmitter 100 or the antenna 250 of the receiver 200 may be input through an input terminal $V_{in}$ of the amplifier. The high frequency signal may be transferred to the matching circuit through the input terminal $V_{in}$ of the amplifier. The matching circuit may include a capacitor $C_{par}$ and an inductor $L_{ser}$.

One end of the capacitor $C_{par}$ of the matching circuit may be connected to a node P1 (for example, the input terminal $V_{in}$ of the amplifier and the inductor $L_{ser}$), and the other end of the capacitor $C_{par}$ of the matching circuit may be connected to a ground. One end of the inductor $L_{ser}$ of the matching circuit may be connected to the node P1 (for example, the input terminal $V_{in}$ of the amplifier and the capacitor $C_{par}$), and the other end of the inductor $L_{ser}$ of the matching circuit may be connected to a gate of the NMOS transistor M. A connection structure between the capacitor $C_{par}$ and the inductor $L_{ser}$ in the matching circuit may be a serial-parallel structure.

An output terminal of the matching circuit may be connected to the gate of the NMOS transistor M. The NMOS transistor M may be used for amplifying a high frequency signal. A source of the NMOS transistor M may be connected to the inductor $L_{dgen}$. Input impedance of the NMOS transistor M may be adjusted by the inductor $L_{dgen}$. A drain of the NMOS transistor M may be connected to a node P2 (for example, the output terminal $V_{out}$ of the amplifier and the load). The load may include at least one resistor. The high frequency signal input through the input terminal $V_{in}$ of the amplifier may be amplified by components in the amplifier (for example, the matching circuit, the NMOS transistor M, the inductor $L_{dgen}$, the load, and the like). The amplified high frequency signal may be output through the output terminal $V_{out}$ of the amplifier. The high frequency signal output through the output terminal $V_{out}$ of the amplifier may be input to the antenna 150 of the transmitter 100 or the mixer 220 of the receiver 200.

Figure 6:
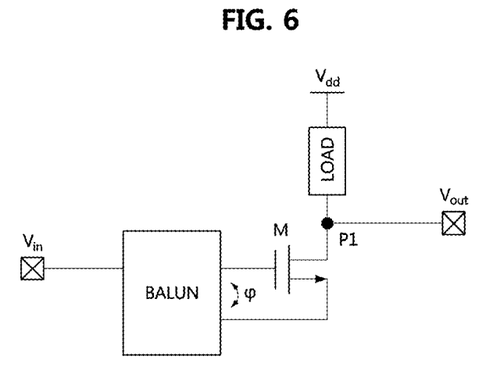
FIG. 6 is a block diagram illustrating a fifth example embodiment of an amplifier.

FIG. 6 is a block diagram illustrating a fifth example embodiment of an amplifier.

Referring to FIG. 6, the amplifier (for example, the amplifier 140 or 240 of FIG. 1) may include a balun, an NMOS transistor M, a load, and the like. An input terminal of the balun may be connected to an input terminal $V_{in}$ of the amplifier. One output terminal (hereinafter, referred to as an output terminal #1) of two output terminals of the balun may be connected to a gate of the NMOS transistor M, and the remaining one output terminal (hereinafter, referred to as an output terminal #2) of the balun may be connected to a source of the NMOS transistor M.

A drain of the NMOS transistor M may be connected to a node P1 (for example, an output terminal $V_{out}$ of the amplifier and the load). The load may include at least one resistor. A high frequency signal input through the input terminal $V_{in}$ of the amplifier may be amplified by components in the amplifier (for example, the balun, the NMOS transistor M, the load, and the like). The amplified high frequency signal may be output through the output terminal $V_{out}$ of the amplifier. The high frequency signal output through the output terminal $V_{out}$ of the amplifier may be input to the antenna 150 of the transmitter 100 or the mixer 220 of the receiver 200.

On the other hand, the balun may be used for converting an input signal (for example, a signal input through the input terminal $V_{in}$ of the amplifier) into a differential signal. For example, a differential signal may be output through each of the output terminal #1 and the output terminal #2 of the balun. A phase difference between a differential signal #1 output through the output terminal #1 of the balun and a differential signal #2 output through the output terminal #2 of the balun may be 180°. However, considering a parasitic component of the NMOS transistor M, the phase difference between the differential signal #1 and the differential signal #2 may have a value different from 180°.

A voltage swing between the gate and the source of the NMOS transistor M may be increased due to the differential signals output from the balun. Thus, effective transconductance may be increased without increasing a size or bias of the NMOS transistor M. No increase in size or bias of the NMOS transistor M may mean that there is no change in power consumption. Since power consumption is maintained and the effective transconductance is also increased by the amplifier including the balun, a gain of the amplifier is increased.

Figure 7:
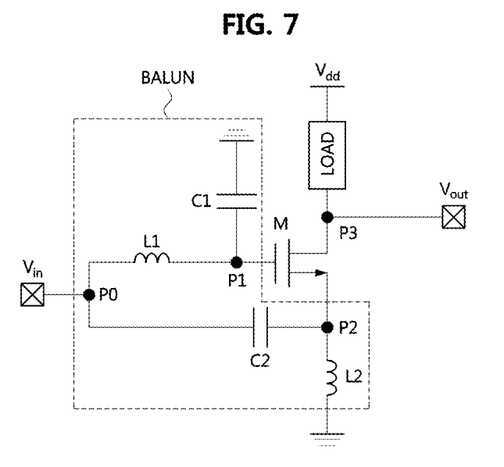
FIG. 7 is a block diagram illustrating a sixth example embodiment of an amplifier.

FIG. 7 is a block diagram illustrating a sixth example embodiment of an amplifier.

Referring to FIG. 7, the amplifier (for example, the amplifier 140 or 240 of FIG. 1) may include a balun, an NMOS transistor M, a load, and the like. An input terminal of the balun may be connected to an input terminal $V_{in}$ of the amplifier. An output terminal #1 of the balun may be connected to a gate of the NMOS transistor M, and an output terminal #2 of the balun may be connected to a source of the NMOS transistor M. A drain of the NMOS transistor M may be connected to a node P3 (for example, an output terminal $V_{out}$ of the amplifier and the load).

The balun may include an inductor #1 L1, an inductor #2 L2, a capacitor #1 C1, and a capacitor #2 C2. The inductor #1 L1 and the capacitor #1 C1 may be disposed between the input terminal $V_{in}$ of the amplifier and the gate of the NMOS transistor M. One end of the inductor #1 L1 may be connected to a node P0 (for example, the input terminal $V_{in}$ of the amplifier), and the other end of the inductor #1 L1 may be connected to a node P1 (for example, the gate of the NMOS transistor M and the capacitor #1 C1). The capacitor #1 C1 may be parallel with the inductor #1 L1. One end of the capacitor #1 C1 may be connected to the node P1 (for example, the gate of the NMOS transistor M and the inductor #1 L1), and the other end of the capacitor #1 C1 may be connected to a ground.

The inductor #2 L2 and the capacitor #2 C2 may be disposed between the input terminal $V_{in}$ of the amplifier and the source of the NMOS transistor M. One end of the capacitor #2 C2 may be connected to the node P0 (for example, the input terminal $V_{in}$ of the amplifier), and the other end of the capacitor #2 C2 may be connected to a node P2 (for example, the source of the NMOS transistor M and the inductor #2 L2). The inductor #2 L2 may be parallel with the capacitor #2 C2. One end of the inductor #2 L2 may be connected to the node P2 (for example, the source of the NMOS transistor M and the capacitor #2 C2), and the other end of the inductor #2 L2 may be connected to the ground.

A signal input through the input terminal of the balun may be divided into two signals. One signal of the two divided signals may be output to the node P1 by the inductor #1 L1 and the capacitor #1 C1, and the remaining signal of the two divided signals may be output to the node P2 by the inductor #2 L2 and the capacitor #2 C2. The signal output to the node P1 may be a differential signal #1, and the signal output to the node P2 may be a differential signal #2. A phase difference between the differential signal #1 and the differential signal #2 may be 180°. A signal (for example, an amplified signal) may be output from the drain of the NMOS transistor M based on the differential signals, and the output signal may be transferred to the output terminal $V_{out}$ of the amplifier. A signal output through the output terminal $V_{out}$ of the amplifier may be input to the antenna 150 of the transmitter 100 or the mixer 220 of the receiver 200.

Figure 8:
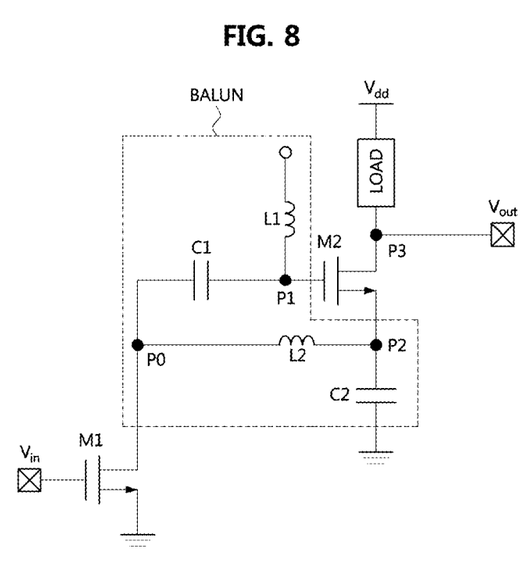
FIG. 8 is a block diagram illustrating a fifth example embodiment of an amplifier.

FIG. 8 is a block diagram illustrating a fifth example embodiment of an amplifier.

Referring to FIG. 8, the amplifier (for example, the amplifier 140 or 240 of FIG. 1) may include a balun, an NMOS transistor #1 M1, an NMOS transistor #2 M2, a load, and the like. The NMOS transistors M1 and M2 may each be configured in the form of a stack in the amplifier. For example, the balun may be disposed between the NMOS transistors M1 and M2. The amplifier including the NMOS transistors M1 and M2 configured in the form of the stack may be a cascade amplifier. A current may be reused in the NMOS transistors M1 and M2 configured in the form of the stack in the amplifier.

A gate of the NMOS transistor #1 M1 may be connected to an input terminal $V_{in}$ of the amplifier, a source of the NMOS transistor #1 M1 may be connected to a ground, and a drain of the NMOS transistor #1 M1 may be connected to an input terminal of the balun (for example, a node P0. A signal input through the input terminal $V_{in}$ of the amplifier may be transmitted to the balun through the NMOS transistor #1 M1. An output terminal #1 of the balun may be connected to a gate of the NMOS transistor #2 M2, and an output terminal #2 of the balun may be connected to a source of the NMOS transistor #2 M2. A drain of the NMOS transistor #2 M2 may be connected to a node P3 (for example, an output terminal $V_{out}$ of the amplifier and the load).

The balun may include an inductor #1 L1, an inductor #2 L2, a capacitor #1 C1, and a capacitor #2 C2. The inductor #1 L1 and the capacitor #1 C1 may be disposed between the drain of the NMOS transistor #1 M1 and the gate of the NMOS transistor #2 M2. One end of the capacitor #1 C1 may be connected to the node P0 (for example, the drain of the NMOS transistor #1 M1), and the other end of the capacitor #1 C1 may be connected to a node P1 (for example, the gate of the NMOS transistor #2 M2 and the inductor #1 L1). The inductor #1 L1 may be parallel with the capacitor #1 C1. One end of the inductor #1 L1 may be connected to the node P1 (for example, the gate of the NMOS transistor #2 M2 and the capacitor #1 C1), and the other end of the inductor #1 L1 may be connected to a ground.

The inductor #2 L2 and the capacitor #2 C2 may be disposed between the drain of the NMOS transistor #1 M1 and the source of the NMOS transistor #2 M2. One end of the inductor #2 L2 may be connected to the node P0 (for example, the drain of the NMOS transistor #1 M1), and the other end of the inductor #2 L2 may be connected to a node P2 (for example, the source of the NMOS transistor #2 M2 and the capacitor #2 C2). The capacitor #2 C2 may be parallel with the inductor #2 L2. One end of the capacitor #2 C2 may be connected to the node P2 (for example, the source of the NMOS transistor #2 M2 and the inductor #2 L2), and the other end of the capacitor #2 C2 may be connected to the ground.

A connection structure between the inductor #1 L1 and the capacitor #1 C1 and a connection structure between the inductor #2 L2 and the capacitor #2 C2 in the balun of FIG. 8 may be different from a connection structure between the inductor #1 L1 and the capacitor #1 C1 and a connection structure between the inductor #2 L2 and the capacitor #2 C2 in the balun described with reference to FIG. 7. For example, the connection structure between the inductor #1 L1 and the capacitor #1 C1 in the balun of FIG. 8 may be a parallel-serial structure, and the connection structure between the inductor #1 L1 and the capacitor #1 C1 in the balun of FIG. 7 may be a serial-parallel structure. The connection structure between the inductor #2 L2 and the capacitor #2 C2 in the balun of FIG. 8 may be a serial-parallel structure, and the connection structure between the inductor #2 L2 and the capacitor #2 C2 in the balun of FIG. 7 may be a parallel-serial structure.

The structural difference between the baluns in FIGS. 7 and 8 may be related to the setting of a bias. In FIG. 7, when the inductor #2 L2 exists between the source of the NMOS transistor M and the ground, a bias current (for example, a direct current (DC) bias current) of the NMOS transistor M may be set. In FIG. 8, when the capacitor #2 C2 exists between the source of the NMOS transistor #2 M2 and the ground, the NMOS transistor #2 M2 may be operated as a common source in terms of operation of a high frequency signal. In this case, since a bias current of the NMOS transistor #2 M2 may be transferred to the NMOS transistor #1 M1, an object of an amplifier (for example, the amplifier including the NMOS transistors M1 and M2 configured in the form of the stack) reusing a current may be achieved.

A signal input through the input terminal of the balun may be divided into two signals. One signal of the two divided signals may be output to the node P1 by the inductor #1 L1 and the capacitor #1 C1, and the remaining signal of the two divided signals may be output to the node P2 by the inductor #2 L2 and the capacitor #2 C2. The signal output to the node P1 may be a differential signal #1, and the signal output to the node P2 may be a differential signal #2. A phase difference between the differential signal #1 and the differential signal #2 may be 180°. A signal (for example, an amplified signal) may be output from the drain of the NMOS transistor #2 M2 based on the differential signals, and the output signal may be transferred to the output terminal $V_{out}$ of the amplifier. A signal output through the output terminal $V_{out}$ of the amplifier may be input to the antenna 150 of the transmitter 100 or the mixer 220 of the receiver 200.

Figure 9:
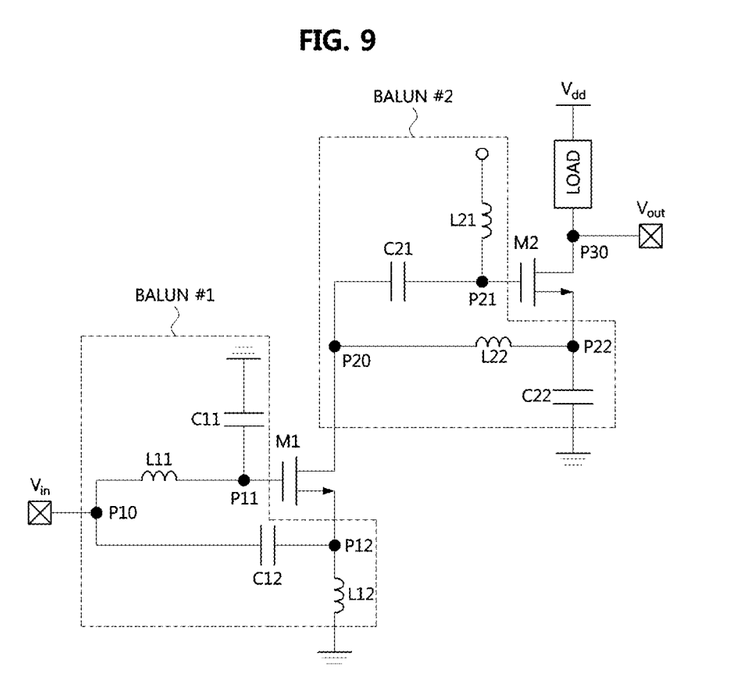
FIG. 9 is a block diagram illustrating an eighth example embodiment of an amplifier.

FIG. 9 is a block diagram illustrating an eighth example embodiment of an amplifier.

Referring to FIG. 9, the amplifier (for example, the amplifier 140 or 240 of FIG. 1) may include a balun #1, a balun #2, an NMOS transistor #1 M1, an NMOS transistor #2 M2, a load, and the like. The amplifier of FIG. 9 may have a form in which the amplifier of FIG. 7 and the amplifier of FIG. 8 are combined. For example, a structure of the "balun #1-NMOS transistor #1 M1" in FIG. 9 may be the same as a structure of the "balun-NMOS transistor M" in FIG. 7. A structure of the "balun #2-NMOS transistor #2 M2" may be the same as a structure of the "balun-NMOS transistor #2 M2" in FIG. 8.

The "balun #1-NMOS transistor #1 M1" and the "balun #2-NMOS transistor #2 M2" in the amplifier of FIG. 9 may each be set in the form of a stack. When a power supply voltage of the transmitter 100 or the receiver 200 is high, at least three balun-NMOS transistors may exist in the amplifier. In this case, the balun #2-NMOS transistors #2 M2 may be repeatedly connected in the amplifier.

An input terminal of the balun #1 may be connected to an input terminal $V_{in}$ of the amplifier. An output terminal #1 of the balun #1 may be connected to a gate of the NMOS transistor #1 M1, and an output terminal #2 of the balun #1 may be connected to a source of the NMOS transistor #1 M1. A drain of the NMOS transistor #1 M1 may be connected to an input terminal of the balun #2.

The balun #1 may include an inductor #11 L11, an inductor #12 L12, a capacitor #11 C11, and a capacitor #12 C12. The inductor #11 L11 and the capacitor #11 C11 may be disposed between the input terminal $V_{in}$ of the amplifier and the gate of the NMOS transistor #1 M1. One end of the inductor #11 L11 may be connected to a node P10 (for example, the input terminal $V_{in}$ of the amplifier), and the other end of the inductor #11 L11 may be connected to a node P11 (for example, the gate of the NMOS transistor #1 M1 and the capacitor #11 C11). The capacitor #11 C11 may be parallel with the inductor #11 L11. One end of the capacitor #11 C11 may be connected to the node P11 (for example, the gate of the NMOS transistor #1 M1 and the inductor #11 L11), and the other end of the capacitor #11 C11 may be connected to a ground.

The inductor #12 L12 and the capacitor #12 C12 may be disposed between the input terminal $V_{in}$ of the amplifier and the source of the NMOS transistor #1 M1. One end of the capacitor #12 C12 may be connected to the node P10 (for example, the input terminal $V_{in}$ of the amplifier), and the other end of the capacitor #12 (C12) may be connected to a node P12 (for example, the source of the NMOS transistor #1 M1 and the inductor #12 L12). The inductor #12 L12 may be parallel with the capacitor #12 C12. One end of the inductor #12 L12 may be connected to the node P12 (for example, the source of the NMOS transistor #1 M1) and the capacitor #12 C12, and the other end of the inductor #12 L12 may be connected to the ground.

A signal input through the input terminal of the balun #1 may be divided into two signals. One signal of the two divided signals may be output to the node P11 by the inductor #11 L11 and the capacitor #11 C11, and the remaining signal of the two divided signals may be output to the node P12 by the inductor #12 L12 and the capacitor #12 C12. The signal output to the node P11 may be a differential signal #11, and the signal output to P12 may be a differential signal #12. A phase difference between the differential signal #11 and the differential signal #12 may be 180°. A signal (for example, an amplified signal) may be output from the drain of the NMOS transistor #1 M1 based on the differential signals, and the output signal may be transferred to the input terminal of the balun #2.

The input terminal of the balun #2 may be connected to the drain of the NMOS transistor #1 M1, an output terminal #1 of the balun #2 may be connected to a gate of the NMOS transistor #2 M2, and output terminal #2 of the balun #2 may be connected to a source of the NMOS transistor #2 M2. A drain of the NMOS transistor #2 M2 may be connected to a node P30 (for example, an output terminal $V_{out}$ of the amplifier and the load).

The balun #2 may include an inductor #21 L21, an inductor #22 L22, a capacitor #21 C21, and a capacitor #22 C22. The inductor #21 L21 and the capacitor #21 C21 may be disposed between the drain of the NMOS transistor #1 M1 and the gate of the NMOS transistor #2 M2. One end of the capacitor #21 C21 may be connected to a node P20 (for example, the drain of the NMOS transistor #1 M1), and the other end of the capacitor #21 C21 may be connected to a node P21 (for example, the gate of the NMOS transistor #2 M2 and the inductor #21 L21). The inductor #21 L21 may be parallel with the capacitor #21 C21. One end of the inductor #21 L21 may be connected to the node P21 (for example, the gate of the NMOS transistor #2 M2 and the capacitor #21 C21).

The inductor #22 L22 and the capacitor #22 C22 may be disposed between the drain of the NMOS transistor #1 M1 and the source of the NMOS transistor #2 M2. One end of the inductor #22 L22 may be connected to the node P20 (for example, the drain of the NMOS transistor #1 M1), and the other end of the inductor #22 L22 may be connected to a node P22 (for example, the source of the NMOS transistor #2 M2 and the capacitor #22 C22). The capacitor #22 C22 may be parallel with the inductor #22 L22. One end of the capacitor #22 C22 may be connected to the node P22 (for example, the source of the NMOS transistor #2 M2 and the inductor #22 L22), and the other end of the capacitor #22 C22 may be connected to the ground.

A signal input through the input terminal of the balun #2 may be divided into two signals. One signal of the two divided signals may be output to P21 by the inductor #21 L21 and the capacitor #21 C21, and the remaining signal of the divided signals may be output to P22 by the inductor #22 L22 and the capacitor #22 C22. The signal output to P21 may be a differential signal #21, and a signal output to P22 may be a differential signal #22. A phase difference between the differential signal #21 and the differential signal #22 may be 180°. A signal (for example, an amplified signal) may be output from the drain of the NMOS transistor #2 M2 based on the differential signals, and the output signal may be transferred to the output terminal $V_{out}$ of the amplifier. A signal output through the output terminal $V_{out}$ of the amplifier may be input to the antenna 150 of the transmitter 100 or the mixer 220 of the receiver 200.

Figure 10A:
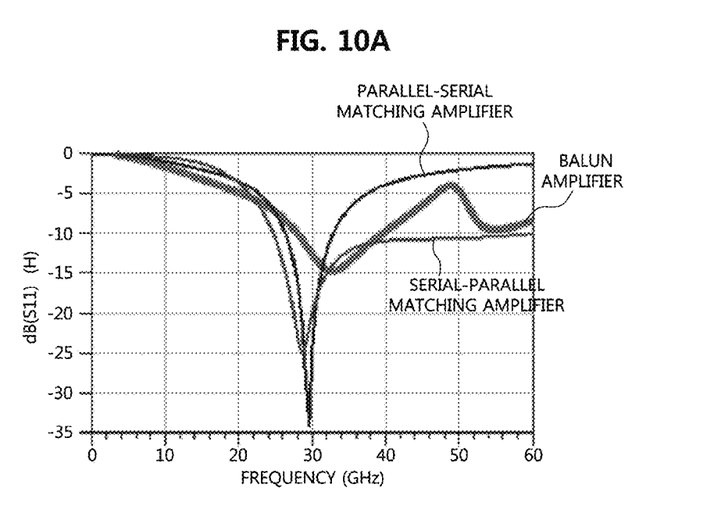
FIG. 10A is a first graph showing an experimental result of an S-parameter for an amplifier.
Figure 10B:
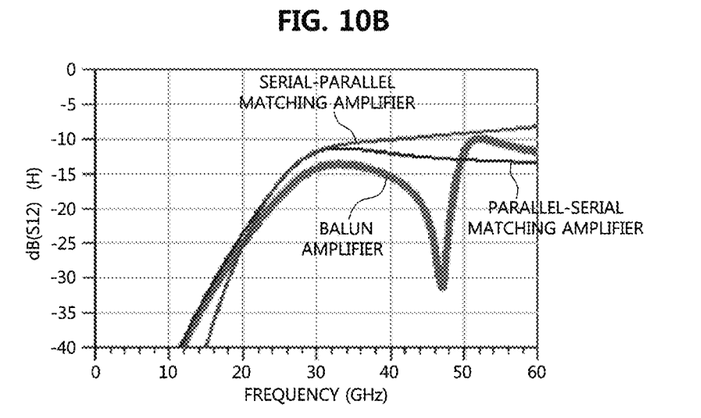
FIG. 10B is a second graph showing an experimental result of an S-parameter for an amplifier.
Figure 10C:
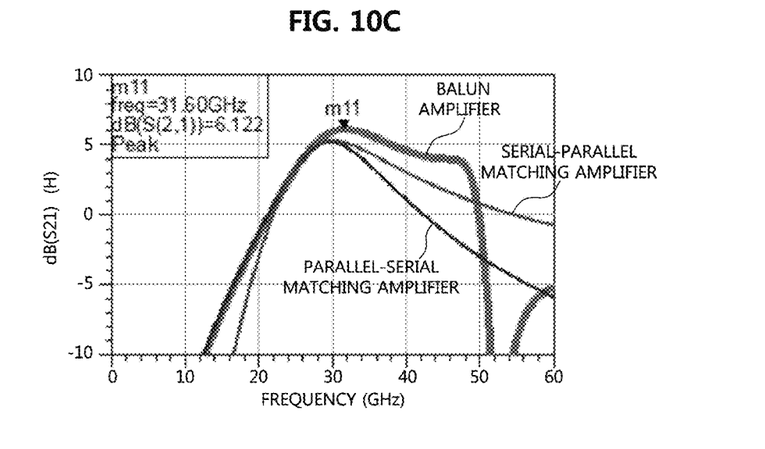
FIG. 10C is a third graph showing a experimental result of an S-parameter for an amplifier.
Figure 10D:
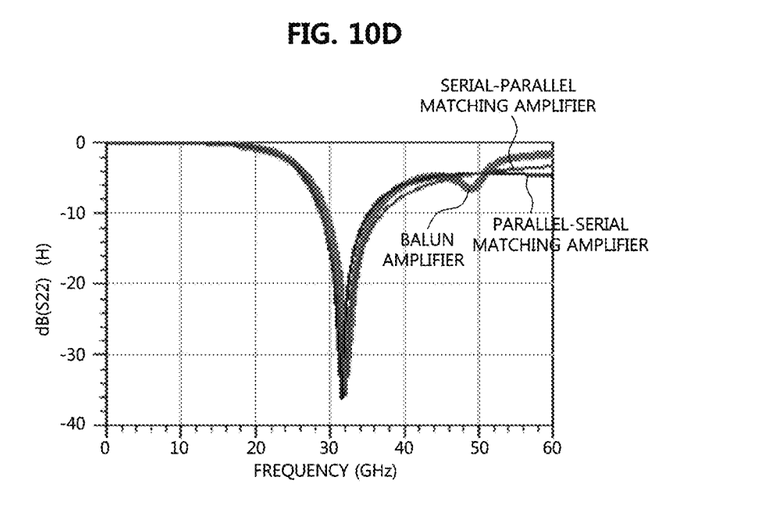
FIG. 10D is a fourth graph showing an experimental result of an S-parameter for an amplifier.

FIG. 10A is a first graph showing an experimental result of an S-parameter for an amplifier, FIG. 10B is a second graph showing an experimental result of an S-parameter for an amplifier, FIG. 10C is a third graph showing a experimental result of an S-parameter for an amplifier, and FIG. 10D is a fourth graph showing an experimental result of an S-parameter for an amplifier.

Referring to FIGS. 10A to 10D, the amplifier illustrated in FIG. 4 (hereinafter, referred to as a serial-parallel matching amplifier), the amplifier illustrated in FIG. 5 (hereinafter, referred to as a parallel-serial matching amplifier), and the amplifier illustrated in FIG. 7 (hereinafter referred to as, a balun amplifier) may be used for an experiment on an S-parameter. A source degeneration method may be applied to the serial-parallel matching amplifier, the parallel-to-serial matching amplifier, and the balun amplifier. In the serial-parallel matching amplifier and the parallel-to-serial matching amplifier, in a state in which a real value of input impedance is increased based on an inductor $L_{dgen}$, impedance may be matched to 50 ohms using an LC circuit.

A value of an inductor #2 L2 in the balun amplifier may be set equal to a value of an inductor $L_{dgen}$ in the serial-parallel matching amplifier and the parallel-serial matching amplifier. A structure of the balun amplifier, excluding a balun, may be the same as a structure of each of the serial-parallel matching amplifier and the parallel-serial matching amplifier excluding a matching circuit. In addition, values of components (for example, an NMOS transistor M, a load, and the like) of the balun amplifier excluding the balun may be the same as values of components of each of the serial-parallel matching amplifier and the parallel-serial matching amplifier excluding the matching circuit.

In terms of a gain of the amplifier, the balun amplifier may have the highest gain among the serial-parallel matching amplifier, the parallel-serial matching amplifier, and the balun amplifier. In terms of a supportable bandwidth of the amplifier, the balun amplifier may have the widest supportable bandwidth among the series-parallel matching amplifier, the parallel-to-serial matching amplifier, and the balun amplifier. In terms of reverse isolation performance of the amplifier in a band of interest, the balun amplifier may have the highest reverse isolation blocking performance among the serial-parallel matching amplifier, the parallel-to-serial matching amplifier, and the balun amplifier.

Figure 11:
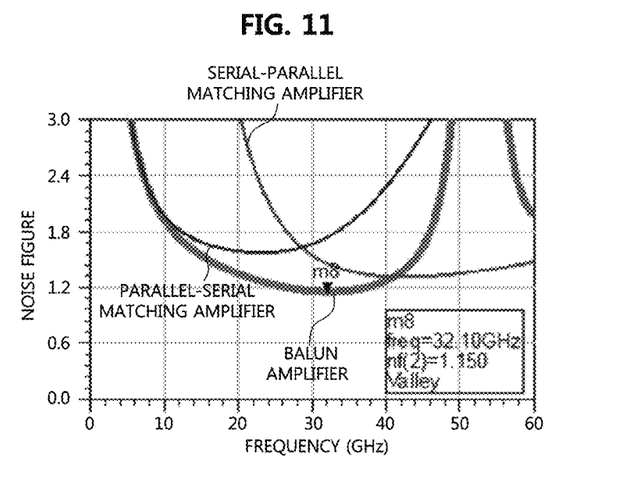
FIG. 11 is a graph showing an experimental result of a noise figure for an amplifier.

FIG. 11 is a graph showing an experimental result of a noise figure for an amplifier.

Referring to FIG. 11, a serial-parallel matching amplifier (i.e., the amplifier illustrated in FIG. 4), a parallel-serial matching amplifier (i.e., the amplifier illustrated in FIG. 5), and a balun amplifier (i.e., the amplifier illustrated in FIG. 7) may be used for an experiment on a noise figure. In terms of a noise figure of the amplifier in a band of interest, the balun amplifier may have the highest noise figure among the serial-parallel matching amplifier, the parallel-to-serial matching amplifier, and the balun amplifier According to the present invention, impedance matching can be maintained between components in an amplifier. A gain, a low noise characteristic, and the like of the amplifier can be improved. In addition, a bandwidth supportable by the amplifier can be increased.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. An amplifier for amplifying a high frequency signal in a transceiver of a wireless communication system, the amplifier comprising:
   an input terminal through which the high frequency signal is input;
   a balun which is connected to the input terminal to acquire the high frequency signal from the input terminal and outputs a first differential signal and a second differential signal based on the high frequency signal;
   a transistor which is connected to the balun to acquire the first differential signal and the second differential signal from the balun and outputs an amplified high frequency signal based on the first differential signal and the second differential signal;
   a load which is connected to the transistor; and
   an output terminal which is connected to the transistor to acquire the amplified high frequency signal and through which the amplified high frequency signal is output,
   wherein a phase difference between the first differential signal and the second differential signal is 180°,
   wherein the balun includes a first inductor, a second inductor, a first capacitor, and a second capacitor,
   wherein the first inductor has one end connected to the input terminal and the other end connected to a gate of the transistor, the first capacitor is parallel with the first inductor and has one end connected to the gate of the transistor and the other end connected to a ground, the second capacitor has one end connected to the input terminal and the other end connected to a source of the transistor, and the second inductor is parallel with the second capacitor and has one end connected to the source of the transistor and the other end connected to the ground.

2. The amplifier of claim 1, wherein the transistor is an n-channel metal oxide semiconductor (NMOS) transistor.

3. An amplifier for amplifying a high frequency signal in a transceiver of a wireless communication system, the amplifier comprising:
   an input terminal through which the high frequency signal is input;
   a first transistor which is connected to the input terminal to acquire the high frequency signal and outputs an output signal based on the high frequency signal;
   a balun which is connected to the first transistor to acquire the output signal from the first transistor and outputs a first differential signal and a second differential signal based on the output signal;
   a second transistor which is connected to the balun to acquire the first differential signal and the second differential signal from the balun and outputs an amplified high frequency signal based on the first differential signal and the second differential signal;
   a load which is connected to the second transistor; and
   an output terminal which is connected to the second transistor to acquire the amplified high frequency signal is acquired and through which the amplified high frequency signal is output,
   wherein a phase difference between the first differential signal and the second differential signal is 180°,
   wherein the balun includes a first inductor, a second inductor, a first capacitor, and a second capacitor,
   wherein the first capacitor has one end connected to drain of the first transistor and the other end connected to a gate of the second transistor, the first inductor is parallel with the first capacitor and has one end connected to the gate of the second transistor, the second inductor has one end connected to the drain of the first transistor and the other end connected to a source of the second transistor, and the second capacitor is parallel with the second inductor and has one end connected to the source of the second transistor and the other end connected to a ground.

4. The amplifier of claim 3, wherein a bias current of the second transistor is introduced into the first transistor by the second inductor and is reused in the first transistor.

5. The amplifier of claim 3, wherein each of the first transistor and the second transistor is an n-channel metal oxide semiconductor (NMOS) transistor and is configured in a form of a stack in the amplifier.

6. An amplifier for amplifying a high frequency signal in a transceiver of a wireless communication system, the amplifier comprising:
   an input terminal through which the high frequency signal is input;
   a first balun which is connected to the input terminal to acquire the high frequency signal from the input terminal and outputs a first differential signal and a second differential signal based on the high frequency signal;
   a first transistor which is connected to the first balun to acquire the first differential signal and the second differential signal from the first balun and outputs a first amplified high frequency signal based on the first differential signal and the second differential signal;
   a second balun which is connected to the first transistor to acquire the first amplified high frequency signal and outputs a third differential signal and a first differential signal based on the first amplified high frequency signal;
   a second transistor which is connected to the second balun to acquire the third differential signal and the fourth differential signal from the second balun and outputs a second amplified high frequency signal based on the third differential signal and the fourth differential signal;
   a load which is connected to the second transistor; and
   an output terminal which is connected to the second transistor to acquire the second amplified high frequency signal and through which the second amplified high frequency signal is output,
   wherein the first balun includes a first inductor, a second inductor, a first capacitor, and a second capacitor, wherein the first inductor has one end connected to the input terminal and the other end connected to a gate of the first transistor, the first capacitor is parallel with the first inductor and has one end connected to the gate of the first transistor and the other end connected to a ground, the second capacitor has one end connected to the input terminal and the other end connected to a source of the first transistor, and the second inductor is parallel with the second capacitor and has one end connected to the first transistor and the other end connected to the ground.

7. The amplifier of claim 6, wherein a phase difference between the first differential signal and the second differential signal is 180°, and a phase difference between the third differential signal and the fourth differential signal is 180°.

8. The amplifier of claim 6,
   wherein the third capacitor having one end connected to a drain of the first transistor and the other end connected to a gate of the second transistor;
   the third inductor having one end connected to the gate of the second transistor;
   the fourth inductor having one end connected to the drain of the first transistor and the other end connected to a source of the second transistor; and
   the fourth capacitor having one end connected to the source of the second transistor and the other end connected to a ground.

9. The amplifier of claim 8, wherein a bias current of the second transistor is introduced into the first transistor by the fourth inductor and is reused in the first transistor.

10. The amplifier of claim 6, wherein each of the first transistor and the second transistor is an n-channel metal oxide semiconductor (NMOS) transistor and is configured in a form of a stack.

* * * * *